United States Patent
Robbins et al.

(10) Patent No.: US 6,365,839 B1
(45) Date of Patent: Apr. 2, 2002

(54) MULTI-LAYER PRINTED CIRCUIT BOARD WITH DUAL IMPEDANCE SECTION

(75) Inventors: Eric F. Robbins, Merrimack, NH (US); Stephen W. Berry, Littleton, MA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/587,307

(22) Filed: Jun. 5, 2000

(51) Int. Cl.$^7$ .............. H05K 1/03; H05K 7/02; H05K 1/11; H01B 11/06

(52) U.S. Cl. .......... 174/255; 174/36; 361/780; 361/792; 361/794; 361/795

(58) Field of Search ............ 174/255, 36; 361/792, 361/793, 794, 795, 780

(56) References Cited

U.S. PATENT DOCUMENTS

| | | | |
|---|---|---|---|
| 5,061,824 A | * 10/1991 | Alexander et al. | 174/250 |
| 5,278,727 A | * 1/1994 | Westbrook et al. | 361/792 |
| 5,912,809 A | * 6/1999 | Steigerwald et al. | 361/780 |
| 6,175,088 B1 | * 1/2001 | Saccocio | 174/262 |

* cited by examiner

Primary Examiner—Kamand Cuneo
Assistant Examiner—Quynh-Nhu H. Vu
(74) Attorney, Agent, or Firm—Casari and McKenna, LLP

(57) ABSTRACT

A multi-layer printed circuit board provides at least two sections thereon. One section has a grouping of high-impedance traces and another adjacent section, separated by a dividing line, has a mainly low-impedance signal traces. The high-impedance section has at least one of a ground and power plane separated from a grouping of central layers, containing the high-impedance traces, by at least one empty or "void" layer. The void layer is likewise filled by the ground and power planes in the within low-impedance section by stepping the ground/power plane inwardly toward the central layers while providing another low-impedance signal trace in the layer above and below the respective ground and power planes. In a preferred embodiment there are at least nine layers of circuit board material with high-impedance traces on a central grouping of at least three central board layers with three layers disposed respectively above and below the central board layers.

4 Claims, 2 Drawing Sheets

MULTI-LAYER PRINTED CIRCUIT BOARD WITH DUAL IMPEDANCE SECTION

FIELD OF INVENTION

This invention relates to printed circuit boards and more particularly to printed circuit boards for use in high-speed computer bus applications.

BACKGROUND OF THE INVENTION

Printed circuit boards having a plurality of layers, each including various conductive planes and printed circuit traces are used widely throughout the computer industry. These boards enable a large number of connections between circuit components to be made in a relatively small surface area. Typically, boards are constructed by laying conductive material (typically near-pure copper), in solid or deposited form, on a layer of resinous material that is typically between three and ten thousands of an inch thickness. The material is selectively etched using known techniques, which can include photolithographic processes, to create a circuit traces. The individual etched layers are then adhered into a precisely positioned sandwich to form a complete multi-layer printed circuit board. Connecting pins from circuit components (chips) pass through the layers and contact a predetermined trace on one of the layers. Solder and/or other electrical connectors form an electrically conductive bridge between the chip pin and the appropriate trace.

It is generally desirable to make the traces as narrow as possible (no less than about 0.005 inch) so that a larger number of traces can be formed upon a given layer.

However, in creating traces, as well as spacing layers from each other, the resulting impedance characteristics of the various layers may be altered significantly. A variety of design rules and equations exist for accurately predicting impedance for a given set of traces in a multi-layer circuit board. In most instances, it is desirable to lower the impedance of circuit board traces to improve signal transmission. This is particularly true of a data bus carrying Protocol Control Information (PCI) known generally as a "PCI bus." Such a PCI bus typically requires a low-impedance pathway on the order of approximately 55 Ohms. However, certain signal arrangements require higher impedance, such as a Small Computer System Interface (SCSI) interconnection used largely for disk controllers. In general, by locating the power and ground planes close to an adjacent layer, a relatively low impedance for signal-carrying traces on that adjacent layer is maintained. Conversely, spacing the power and ground layers more distant from adjacent layers results in higher impedance for the signal traces adjacent layers. Generating appropriate impedance for a given circuit trace involves a number of well-known-but-complex calculations taking into account various variables. These variables include the spacing between board layers, distance from a ground and/or power plane, the relative thickness and height of the trace and the dielectric of the board material. An overlying technique entails the widening and narrowing of the traces to produce, respectively, lower or higher impedance therein. In one example SCSI traces are formed with widths as small as 0.004 inch. This taxes board manufacturing efficiencies and reliability.

One effort to modify the impedance of respective layers is shown is FIG. 1. This diagram is representative of a product available from Sun Microsystems as part of its Sparcstation 4 and Sparcstation 5 products. A circuit board 100 generally representative of the Spark Station product is shown in FIG. 1. It includes five separate board layers according to this example. The insulating structural board material for each layer is typically formed of identical material—a fiberglass product well-known in the art and commercially designated as FR-4. The layers 102, 104, 106, 108 and 110 as shown from top to bottom. Disposed between each layer, and on the top and bottom faces of the board, is a circuit trace of predetermined shape and size. A dividing line 112 delineates a specialized high-impedance section 114 (to be described further below) from the remaining lower/low-impedance board section 116. In the low-impedance board section 116, the topmost trace 118 and the bottommost trace 120 are each low-impedance signal traces. They are located adjacent a ground (GND) plane 122 and an opposing (PWR) plane 124 on directly adjacent layers. By maintaining the ground and power planes in close proximity to the signal traces 118 and 120, a lower impedance can be attained. Internal signal traces 126 and 128 are also located on opposing sides of the central layer 106. These are also in close proximity to the ground and power planes 122, 124 respectively. Hence, the board section 116 maintains its signal traces all at lower impedance. Conversely, the specialized high-impedance section 114, which is typically adjacent SCSI bus connection (described below), benefits by spacing the ground and power planes 122 and 124 at a further spacing from the SCSI traces 130 and 132 located on the top and bottom of the board respectively. This greater spacing is accomplished by stepping each of the ground and power planes 122, 124 inwardly so that they each confront the central layer 106 of the board 100. Accordingly, a larger spacing d between the ground and power planes 122, 124 and the outer SCSI traces 130, 132 is attained.

In this example, the ground and power planes are "stepped" by providing a series of connections known as vias that are formed according to conventional techniques through the respective board layers 104 and 108 enabling the electrically connected steps 134 and 136 to be formed. The area between board layers 102 and 104 and/or 108 and 110 is a "dead zone" or "void" as shown by the dotted lines 140 and 142. Generally, no traces are present in this void area between board layers. In general, the prior art circuit board contained traces having a variety of etch widths to further vary the impedance characteristics. The arrangement detailed in FIG. 1 places the SCSI traces on the external faces of the board. It would be desirable to locate multiple SCSI layers on the internal faces of the board, as this enables more predictable control of impedance and better shielding of circuit traces. In addition, it is desirable to provide a simplified trace construction in which all circuit traces are formed with a reasonably small but constant width to increase packing efficiency, while not requiring overly small widths (under 0.005 inch, that tax the reliability of the board etching process. In addition, it is desirable to provide a board arrangement that enables a greater number of layers to be stacked with greater control over the impedance of traces on the various layers. Accordingly, is an object of this invention to provide such an improved multi-layer board of structure.

SUMMARY OF THE INVENTION

This invention overcomes the disadvantages of the prior art by providing a multi-layer printed circuit board defining a high-impedance section thereon in which power and ground traces extend stepwise toward respective upper and lower external layers while two or more SCSI layers are located within the center of the stack of layers separated from the power and ground layers by at least one "dead zone" or "void" layer—the void layer being produced by the external step of the power and ground layers within the high-impedance section.

According to a preferred embodiment, the board includes at least nine board layers, composed of a resinous material—typically a fiberglass composite such as commercially available FR-4. The high-impedance SCSI circuit trace layers are located in the central portion of the board while low-impedance signal layers can be located on the external faces and also on all layers outside the high-impedance section (e.g. within the low-impedance board section.

All traces can be formed with a width of approximately 5–7 thousandths of an inch (5–7 mils) while maintaining a desired impedance in a range of between approximately 55–85 Ohms.

BRIEF DESCRIPTION OF THE DRAWINGS

The foregoing and other objects and advantages of the invention will become more clear with reference to the following detailed description as illustrated by the drawings in which.

DETAILED DESCRIPTION OF AN ILLUSTRATIVE EMBODIMENT

Figure 1:
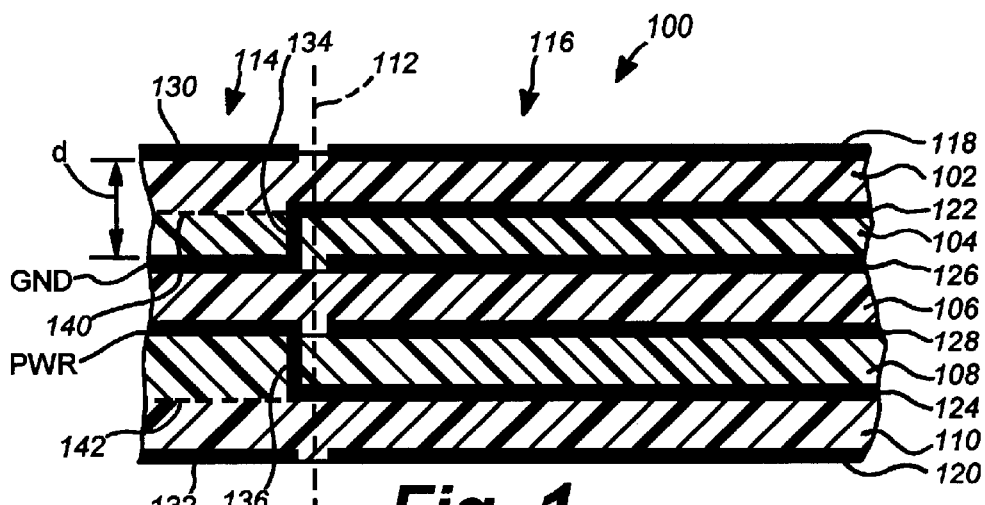
FIG. 1 is a somewhat schematic side cross section of a multi-layer circuit board having a specialized high-impedance section according to the prior art.
Figure 2:
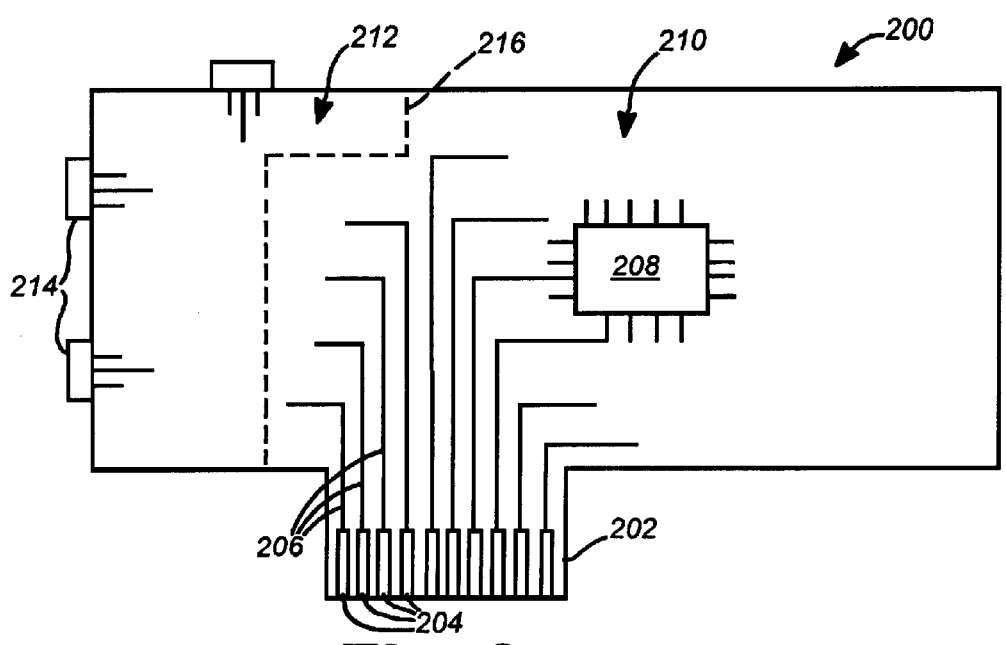
FIG. 2 is a schematic plan view of a generalized multi-layer circuit board having a high-impedance section according to this invention.

FIG. 2 shows a circuit board 200 having a plurality of layers of insulating material that separate respective traces according to an embodiment of this invention. A generalized strip connector 202, for insertion into a computer motherboard, is shown having contacts 204 that interconnect with respective board circuit traces 206. These traces run variously along different layers of the board to interconnect with microprocessors and other circuit components such as the generalized chip 208. As described above, the board of this embodiment is divided into two impedance sections. There is a low-impedance, main-circuitry section 210 that includes the chip 208 and a variety of other functionalities joined, for example, by a PCI bus. There is also an SCSI section 212 in communication with SCSI bus plug connectors 214. The two sections 210 and 212 are separated by a dividing line 216. This dividing line is notional, but defines specific differences in layering that will be described now.

Figure 3:
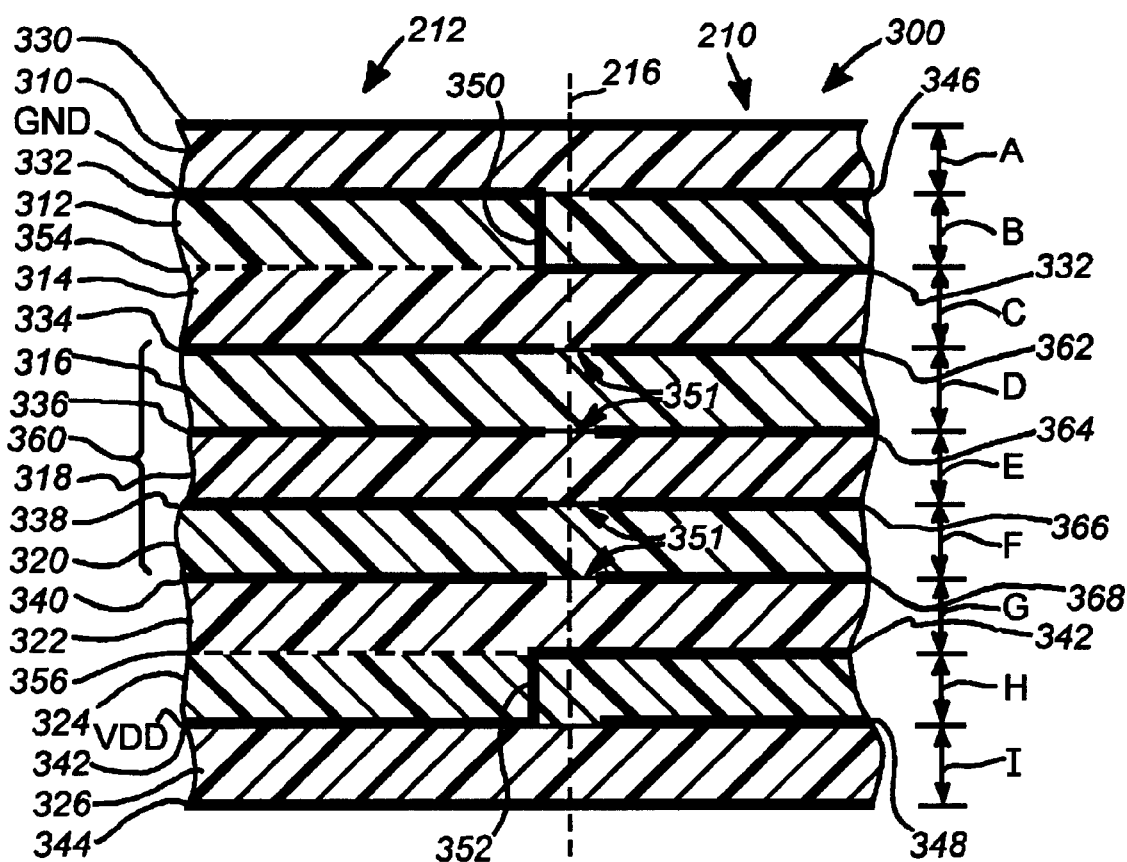
FIG. 3 is a somewhat schematic side view of the multi-layered circuit board of FIG. 2 showing the region adjacent the section boundary.

With reference to FIG. 3, a multi-layer circuit board according to a preferred embodiment of this invention is shown in cross section. The illustrated circuit board section 300 includes ten board layers. The dividing line 216 separates the low-impedance section 210 from the high-impedance (SCSI) section 212, as described above. The respective board layers are denoted from top to bottom by reference numbers 310, 312, 314, 316, 318, 320, 322, 324 and 326. The terms "top" and "bottom" are used as conventions only. The actual orientation of the board can be reversed/inverted. Each layer is typically constructed from a printed circuit board material such as FR-4 fiberglass. On the top layer 310 and bottom layer 326, respectfully, are located signal layer traces 330 and 344. These can be omitted in certain embodiments so that the upper layer of the board at various locations is clear of traces. These traces pass through the dividing line 216 between sections 210 and 212 for reasons discussed below. These are low-impedance signal layers. Again, the top and bottom layers can omitted from one or both sections where appropriate.

The ground (GND) plane 332 is located between the top layer 330 and adjacent layer 312 in the high-impedance (SCSI) section. Likewise, the power (VDD) plane 342 is located between the bottom layer 326 and the next adjacent layer 324 on the high-impedance side. The ground plane 332 and power plane 342 each step inwardly near the dividing line 216 so that they intervene between the next layers 312, 314 and 324, 322, respectfully in the low-impedance section 210. Each step 350 and 352 is accomplished by forming a series of vias according to known techniques. Vias are typically a series of perforations between layers that electrically contact the planes therebetween. Via holes/perforations are typically coated with conductive material applied by deposition or application of solid copper barrels that line the hole between layers. Vias are typically spaced at intervals of 0.1 inch or less to maintain good conductivity.

Between respective layers 312, 314 and 324 and 322 is located a "void" or "dead zone" 354, 356, respectively on the high-impedance side. This void layer separates the high-impedance section's ground and power planes from a group 360 of four central traces 334, 336, 338 and 340 layed against sides of three central board layers 316, 318 and 320. Note that the conductive trace material may have been initially applied to either face of a given fiberglass board layer during construction, and etched accordingly. When all layers are adhered together, the opposing board faces touching a given trace are treated as if either "carries" the given trace thereon from a performance standpoint, and the spacing of each layer from a given trace is considered when determining impedance characteristics of the trace. In other words, the three central board layers 316, 318, and 320 can be said to carry the four traces 334, 336, 338, 340, even though the bottom trace 340 may actually have been etched as part of the next lower board layer 322.

The central grouping of traces is separated at the dividing line 216 from all adjacent low-impedance-section traces 362, 364, 366 and 368 by an associated series of breaks 351. According to a preferred embodiment, he high-impedance trace grouping 360 particularly comprises multiple layers of high-impedance circuit pathways suitable for SCSI bus communication. High-impedance within this grouping is attained particularly because the voids 354 and 356 relocate the ground and power planes sufficiently remote from these central traces so as to raise the characteristic impedance within these traces (based upon known signal processing principles). On the low-impedance side signal layers 346 and 348 are positioned between respective layers 310, 312 and 324, 326. These are in relatively close contact to the respective ground and power planes so that a low-impedance pathway is maintained. The relative spacing between layers is significant for attaining the desired impedance according to a preferred embodiment (while they can be altered substantially according to alternate embodiments). Layer spacing is denoted from the board top to the board bottom as letters A-I. It is as follows:

The top layer 310 has a spacing A of 0.003 inch. The next layer 312 has a spacing B of 0.006 inch. The next layer 314 has a spacing C of 0.010 inch. The next layer 316 has a spacing D of 0.005 inch. The next layer 318 has a spacing E of 0.005 inch. Likewise, the next layer 320 has a spacing F of 0.005 inch. The next layer 322 has a spacing G of 0.010 inch. The next layer 324 has a spacing H of 0.06 inch, and finally, the bottom layer 326 has a spacing I of 0.003 inch.

The spacings listed above are approximate, and are highly variable. This variability is based in part upon prevailing trace width. Significantly, according to this embodiment, the given spacing enables trace widths of between 0.005 and 0.006 of an inch (mils) for all traces. As noted, the prior art typically requires SCSI traces to be narrower. The ability to utilize larger uniform traces (while still reasonably small) eases design and production difficulties. For the given trace size, the SCSI grouping 360 exhibits an approximate impedance of 85 Ohms, while the signal traces, power and ground planes exhibit a significantly lower impedance in the range of 55–65 Ohms. The exact impedance can be varied by changing the particular trace size within preset limits. Typically, the layering is such that certain traces will exhibit slightly higher impedance while other traces will exhibit slightly lower impedances. PCI bus signals can be placed where characteristically low impedance is exhibited (in the range of 55 Ohms) while other less-sensitive signals can be placed where slightly higher impedance is observed. In any case the SCSI impedance is significantly higher, as desired.

As noted above, the exact layout of spacing and trace width can be determined by a variety of well-known techniques. A technique for determining trace size and spacing, as well as layout patterns is described in the text *High-Speed Digital Design, A Handbook of Black Magic* by Howard W. Johnson Ph.D. and Martin Graham Ph.D., published by PTR Prentice Hall, Englewood Cliffs, N.J. (1993). This text specifically outlines the use of a well-known computer aided design program, MathCAD. This is discussed in, for example, Appendix C at page 430, onward. The listed formulas define various parameters for traces where "skinny" traces are employed in which the height of the traces less than its width and "wide" traces are employed where the height of the trace is less than its width. Given the basic parameters described herein, variations in the impedance of a given set of traces can be varied by changing overall layer spacing and/or width of a trace and measuring the resulting changes on a trial-and-error basis.

The forgoing has been a detailed description of a preferred embodiment of the invention. Various modifications and additions can be made without departing from the spirit and scope of the invention. For example, a greater or lesser number of layers than that shown herein can be employed. The number of high-impedance layers can be reduced from the four that are depicted. Multiple ground and power and/or power planes can be included in various layers. Accordingly, this invention is meant to be taken only by way of example, and not to otherwise limit the scope of the invention.

What is claimed is:

1. A multi-layer printed circuit board comprising;

a plurality of layers, including, in order from a top layer to a bottom layer, at least layer A, layer B, layer C, layer D, layer E, layer F, layer G, layer H, and layer I, wherein layer A and layer I are each the top layer and the bottom layer, respectively, and layer D, layer E, and layer F together define central layers;

wherein the plurality of layers further define a high-impedance section and a low-impedance section separated by a boundary passing through each of the plurality of layers;

in the high-impedance section, a ground plane located between layer A and layer B and a power plane located between layer H and layer I, each of the ground plane and the power plane respectively including, adjacent to the boundary, a step toward the central layers so that the ground plane and the power plane extend from the step into the low-impedance section, respectively, between layer B and layer C and layer G and layer H; and in each of the high-impedance section and the low-impedance section, signal traces between each of layer C and layer D, layer D and layer E, layer E and layer F, and layer F and layer G, the signal traces being broken at the boundary so as to define high-impedance signal traces in the high-impedance section and low-impedance signal traces in the low-impedance section, respectively.

2. The printed circuit board as set forth in claim 1 wherein the signal traces have a width in a range of approximately 0.005–0.007 inch.

3. The printed circuit board as set forth in claim 2 wherein each of the central layers each have a thickness of approximately 0.005 inch and wherein the layers adjacent to the central layers have a width of approximately 0.010 inch.

4. The printed circuit board as set forth in claim 3 wherein at least one of the signal traces in the high-impedance section define a characteristic impedance of at least approximately 85 Ohms and at least one of the signal traces in the low-impedance section defines a characteristic impedance of less than 65 Ohms.

* * * * *

UNITED STATES PATENT AND TRADEMARK OFFICE
CERTIFICATE OF CORRECTION

PATENT NO. : 6,365,839 B1
DATED : April 2, 2002
INVENTOR(S) : Eric F. Robbins et al.

It is certified that error appears in the above-identified patent and that said Letters Patent is hereby corrected as shown below:

<u>Title page,</u>
Item [74], the *Attorney, Agent, or Firm* name is spelled incorrectly. It presently reads as "Casari and McKenna, LLP", but it should instead read as, -- "Cesari and McKenna, LLP" --

Signed and Sealed this

Twenty-eighth Day of May, 2002

*Attest:*

JAMES E. ROGAN
*Director of the United States Patent and Trademark Office*

*Attesting Officer*